United States Patent
Matsuki et al.

(10) Patent No.: US 6,759,344 B2
(45) Date of Patent: Jul. 6, 2004

(54) METHOD FOR FORMING LOW DIELECTRIC CONSTANT INTERLAYER INSULATION FILM

(75) Inventors: Nobuo Matsuki, Tama (JP); Yoshinori Morisada, Tama (JP); Atsuki Fukazawa, Tama (JP); Manabu Kato, Tama (JP)

(73) Assignee: ASM Japan K.K., Tama (JP)

( * ) Notice: Subject to any disclaimer, the term of this patent is extended or adjusted under 35 U.S.C. 154(b) by 0 days.

(21) Appl. No.: 10/309,401

(22) Filed: Dec. 3, 2002

(65) Prior Publication Data
US 2003/0143867 A1 Jul. 31, 2003

Related U.S. Application Data
(60) Provisional application No. 60/352,718, filed on Jan. 29, 2002.

(51) Int. Cl.[7] .............................................. H01L 21/31
(52) U.S. Cl. ....................... 438/758; 438/758
(58) Field of Search ........................................ 438/758

(56) References Cited

U.S. PATENT DOCUMENTS

| | | | |
|---|---|---|---|
| 5,316,796 A | | 5/1994 | Awaya et al. |
| 5,591,486 A | * | 1/1997 | Okano et al. ........... 427/255.28 |
| 6,152,071 A | * | 11/2000 | Akiyama et al. ..... 118/723 VE |
| 6,159,871 A | * | 12/2000 | Loboda et al. .............. 438/786 |
| 6,294,482 B1 | * | 9/2001 | Kim .......................... 438/770 |
| 6,352,945 B1 | | 3/2002 | Matsuki et al. |
| 6,383,955 B1 | | 5/2002 | Matsuki et al. |
| 6,395,649 B1 | * | 5/2002 | Wu ............................. 438/778 |
| 6,410,463 B1 | | 6/2002 | Matsuki |
| 6,413,879 B1 | * | 7/2002 | Maeda ........................ 438/758 |
| 6,420,276 B2 | * | 7/2002 | Oku et al. ................... 438/758 |
| 6,432,846 B1 | | 8/2002 | Matsuki |
| 6,448,186 B1 | * | 9/2002 | Olson et al. ................ 438/758 |
| 6,455,445 B2 | | 9/2002 | Matsuki |
| 6,472,333 B2 | * | 10/2002 | Xia et al. .................... 438/758 |
| 6,537,923 B1 | * | 3/2003 | Bhatt et al. ................. 438/758 |
| 2001/0041250 A1 | | 11/2001 | Werkhoven et al. |

FOREIGN PATENT DOCUMENTS

EP   1 039 523 A2   9/2000

OTHER PUBLICATIONS

Nur Selamoglu, et al., Silicon oxide deposition from tetra-ethoxysilane in a radio frequency downstream reactor: Mechanisms and step coverage, Journal of Vacuum Science and Technology: Part B, American Institute of Physics. New York, vol. 7, No. 6, Nov. 1, 2989, pp. 1345–1351.

* cited by examiner

Primary Examiner—John F. Niebling
Assistant Examiner—Stanetta Isaac
(74) Attorney, Agent, or Firm—Knobbe Martens Olson & Bear, LLP

(57) ABSTRACT

An insulation film is formed on a semiconductor substrate by a method including the steps of: (i) introducing a source gas comprising a compound composed of at least Si, C, and H into a chamber; (ii) introducing in pulses an oxidizing gas into the chamber, wherein the source gas and the oxidizing gas form a reaction gas; and (iii) forming an insulation film on a semiconductor substrate by plasma treatment of the reaction gas. The plasma treatment may be plasma CVD processing.

25 Claims, 2 Drawing Sheets

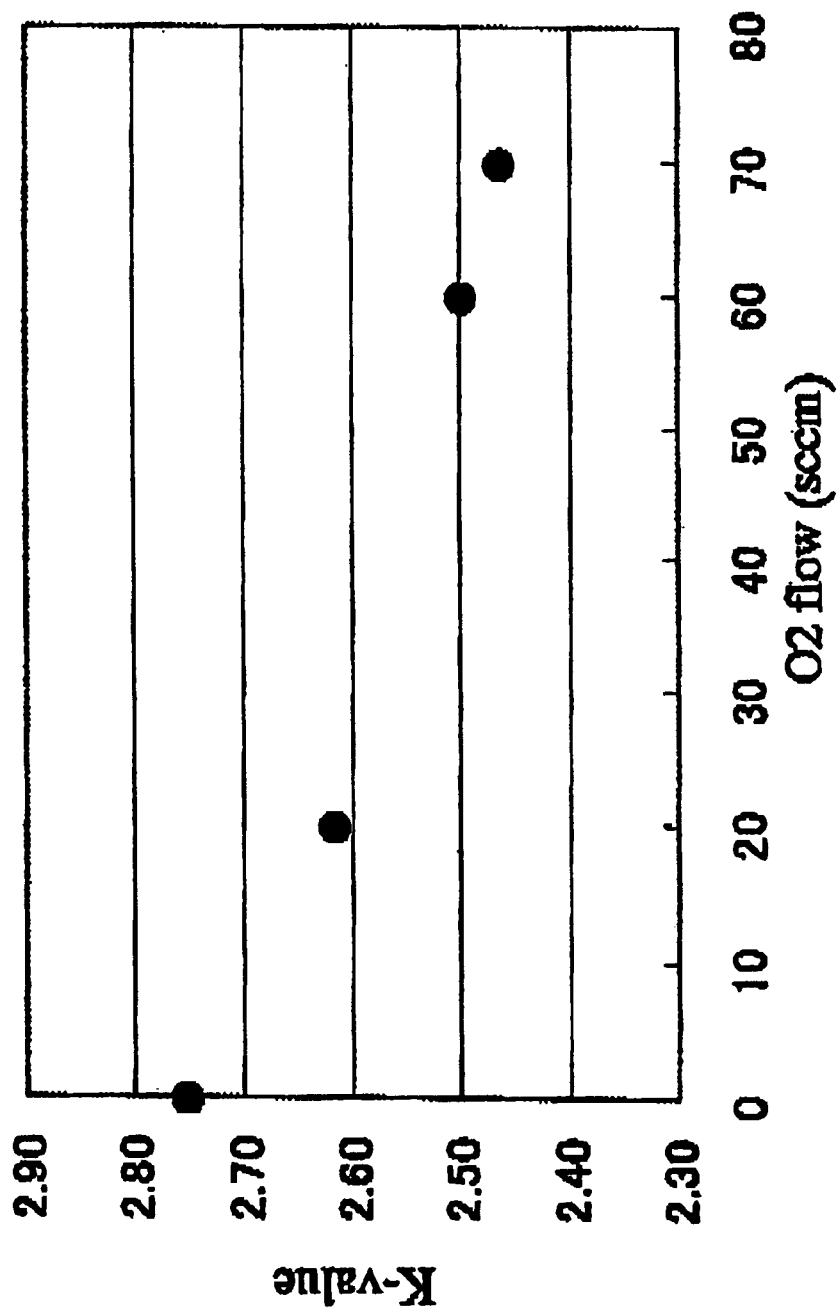
Fig. 2 : O2 flow vs. k-value by non-pulsed process

METHOD FOR FORMING LOW DIELECTRIC CONSTANT INTERLAYER INSULATION FILM

This application claims the benefit of prov. application 60/352,718 filed on Jan. 29, 2002.

BACKGROUND OF THE INVENTION

1. Field of the Invention

The present invention relates generally to a semiconductor technique and more particularly to a method for forming an interlayer insulation film having a low dielectric constant (low-k) on a semiconductor substrate by using a plasma CVD (chemical vapor deposition) apparatus.

2. Description of the Related Art

Because of the recent rise in requirements for the large-scale integration of semiconductor devices, a multi-layered wiring technique attracts a great deal of attention. These multi-layered structures, however, capacitance among individual wires hinders high-speed operations. In order to reduce the capacitance it is necessary to reduce the dielectric constant (relative permittivity) of the insulation film. Thus, various materials having a relatively low dielectric constant have been developed for insulation films.

As shown in the table below, along with reduction of a device node, a low dielectric constant value (Low-k) is required for an interlayer insulation film used for the device concerned.

| Time to be applied | Device Node | k Value |
|---|---|---|
| 2001 | 130 nm | 3.0–3.6 |
| 2003 | 100 nm | 3.0–3.6 |
| 2005 | 80 nm | 2.6–3.1 |
| 2007 | 65 nm | 2.3–2.7 |

As to Low-k films with a dielectric constant of approximately 2.7, because many deposition methods such as a CVD method, coating method, etc. have been proposed, high-quality Low-k deposition becomes possible in recent years. As a result, application of the films to mass-produced devices with a device node of 0.10 to 0.13 $\mu$m has just started. For next-generation high-speed devices, Low-k films having a furthermore lower dielectric constant of approximately k=2.5 or less will be required. Additionally, to manufacture devices, improving reliability of the devices is attempted by incorporating a hard layer being relatively hard with a high dielectric constant on the top, intermediate or the bottom surface of the Low-k film. Because a dielectric constant increases if the hard layer is incorporated in this way, Low-k films with a low dielectric constant as much as possible are required.

SUMMARY OF THE INVENTION

The present invention enables forming a low dielectric constant film of k<2.40 by introducing a pulse control flow of oxidizing gas into a gas containing silicon gas using a CVD method. Further, although conventional methods for controlling oxygen are different from the present invention, the present invention can be applied to conventional apparatus and make it possible to reduce capital investment manufacturing costs because CVD Low-k deposition devices for approximately k=2.7 deposition can easily be modified and used for the present invention. In the present invention, oxidizing gas is introduced in pulses and is mixed with and made to react with a source gas (material gas for forming a film) comprising silicon in a reaction zone. By pulse-controlling the flow of oxidizing gas in plasma CVD processing, the reactivity of the reaction gas (composed of the source gas and the oxidizing gas) can effectively be controlled, forming a low dielectric constant film. The residence time of the reaction gas in the reaction zone or the type of silicon-containing gas such as $Si_\alpha O_{\alpha-1} R_{2\alpha-\beta+1} (OCH_n H_{2n+1})_\beta$ gas is not prerequisites for practicing the present invention. However, these factors may be controlled, and in embodiments, DM-DMOS (Dimethydimetoxysilane, $Si(CH_3)_2(OCH_3)_2$) and oxygen may be used, oxygen may be used as an oxidizing agent, and a low-dielectric film may be formed, as disclosed in U.S. patent application Ser. No. 09/827,616, filed Apr. 6, 2002. The disclosure of the application is herein incorporated by reference in its entirety.

In an embodiment, the present invention provides a method for forming an insulation film on a semiconductor substrate, comprising the steps of: (i) introducing a source gas comprising a compound composed of at least Si, C, and H into a chamber; (ii) introducing in pulses an oxidizing gas into the chamber, wherein the source gas and the oxidizing gas form a reaction gas; and (iii) forming an insulation film on a semiconductor substrate by plasma treatment of the reaction gas. In the above, the plasma treatment may be plasma CVD processing. The plasma CVD processing includes plasma-enhanced CVD (PECVD) processing and remote plasma processing in which the reaction zone and the film formation zone are different. Any suitable CVD processing can be employed.

Increasing a flow of oxidizing gas increases the reactivity of the reaction zone and the size of fragments formed in the reaction zone, which lowers the dielectric constant value because a film obtained includes vacancies or pores between fragments accumulated. It is inferred that when an oxidizing gas flow increases, the size of fragments forming in the reaction zone increases, a vacancy rate or porosity of the film increases and a dielectric constant decreases. However, lowering a k value up to approximately 2.45 appears to be the limit even if the flow of oxidizing gas increases. If the oxygen amount increases more, dust is generated in the reaction zone and high-quality films cannot be obtained, and these films may not possess any measurable dielectric constant. Additionally, plasma becomes unstable and a stable reaction cannot be maintained. In the present invention, by introducing an oxidizing gas in pulses, surprisingly, the above problems can be eliminated.

In an embodiment, the compound is an organo silicon of SixCyOzHa wherein a, x, y, and z are integers. The source gas comprises silicon-containing gas and optionally inert gas such as H and Ar (e.g., less than a half of the silicon-containing gas). The oxidizing gas may be included in an additive gas which may further include inert gas or reducing gas, depending on the reaction of film formation.

The oxidizing gas may be introduced in the chamber in cycles of 5 msec to 10 sec, although the duration of one cycle can be shorter or longer than the above, including 1 msec and 20 sec depending on the reaction of film formation. A pulse cycle is repeated multiple times, e.g., 2–10,000 times including 10, 100, 1,000 times, during the film formation process. In an embodiment, the oxidizing gas is introduced in the chamber in cycles of 100 msec to 5 sec. The oxidizing gas can be oxygen, $N_2O$, or any other gas which can function as an oxidizing agent, including $CO_2$, $H_2O$; a cyclic organic compound having the formula $(CH_2O)_n$ such as 1,3,5-trioxan; or an alkanol compound having the formula $C_xH_{2x+1}OH$ (x is an integer) such as ethanol, methanol, n-propanol, or 1-propanol. In the above, alkanol itself is considered to be a reducing agent, but when alkanol is mixed with an organo silicon gas for film formation, a source gas oxidization reaction occurs. Thus, alkanol functions as an oxidizing agent. The usable oxidizing agent is not limited to the above and any of the foregoing can be used singly or in any combination.

In an embodiment, the introduction of the oxidizing gas in pulses can be achieved by introducing alternately (i) a first reaction gas comprising the source gas at a base flow rate and the oxidizing gas at a flow rate of 50% or higher of the base flow rate, and (ii) a second reaction gas comprising the source gas at a base flow rate and no oxidizing gas or the oxidizing gas at a flow rate of 50% or less of the base flow rate. The total flow of the oxidizing gas may be less than the flow of the source gas or in an embodiment, less than 50% of the source gas.

In the present invention, the pulses and the flow of the oxidizing gas can be selected so as to adjust a dielectric constant of the insulation film to 2.45 or less.

A plasma may be formed by RF power, although microwave power can be used in an embodiment. Further, when RF power is used, the intensity of RF power may be pulsed in cycles synchronized with the pulsed flow of the oxidizing gas, so that low-dielectric films can effectively be formed. In an embodiment, the intensity of RF power is higher in cycles when the oxidizing gas flow is low than in cycles when the oxidizing gas flow is high. In an embodiment, the intensity of RF power may be pulsed in cycles of 1 msec or more, independently of the pulses of the oxidizing gas flow.

Additionally, the formation of the insulation film may be conducted while maintaining a temperature of a shower plate at 150° C. or higher, through which the reaction gas passes into the chamber.

The insulation film may be a cap layer having a thickness of 10 nm or more in an embodiment, although the type or usage of film should not be limited.

The present invention enables forming of a low dielectric constant film in the plasma CVD method. By using this low dielectric constant film as an insulation film for next-generation highly integrated semiconductor elements, delay caused by wiring capacity can be lowered and the operation speed of a semiconductor element can be substantially increased.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

FIG. 2 is a graph showing the relationship between k values of insulation films and non-pulsed oxidizing gas flow.

DETAILED DESCRIPTION OF THE PREFERRED EMBODIMENT

Figure 1:
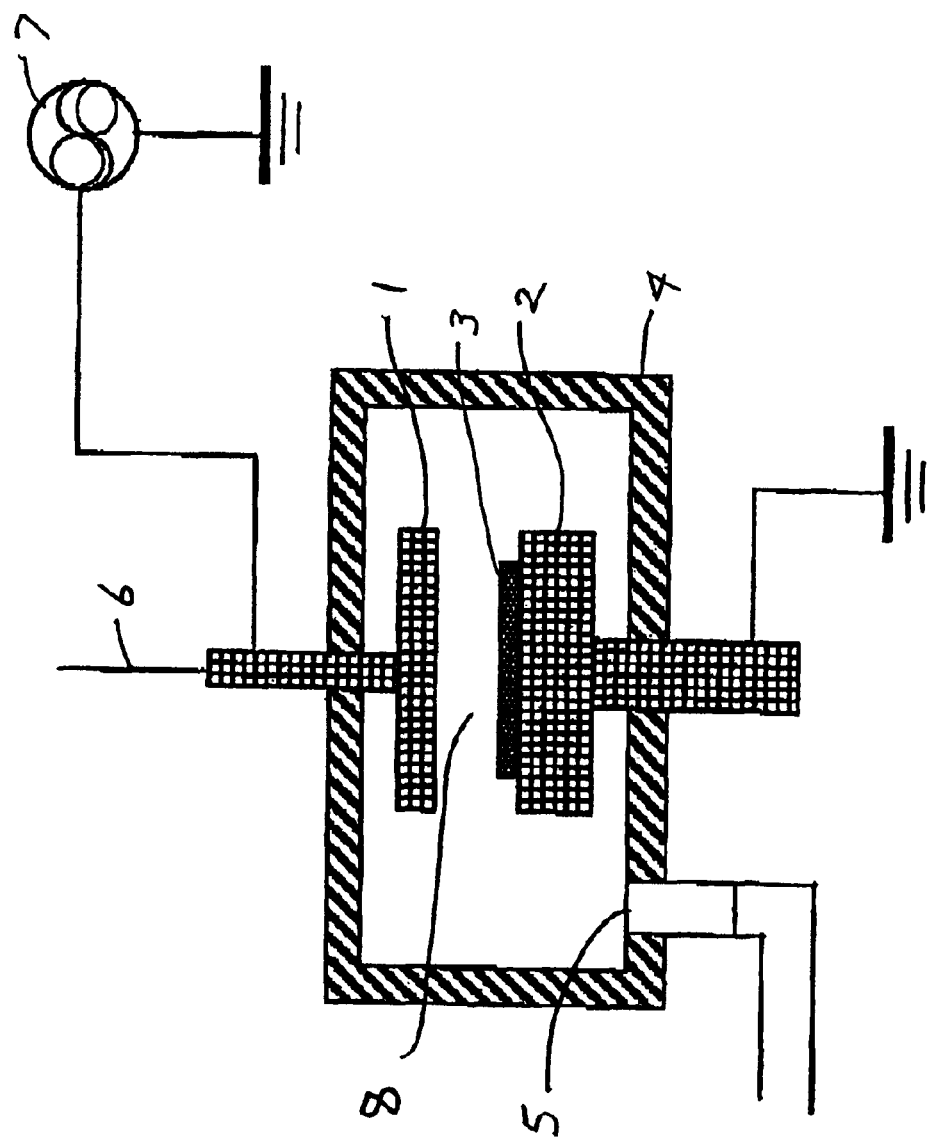
FIG. 1 is a schematic diagram illustrating a plasma CVD apparatus used for forming an insulation film.

An embodiment, the present invention is characterized in that oxidizing gas is introduced in a pulse cycle.

This feature is applicable to and effective in any methods for forming a low-k film using an oxidizing gas for a silicon gas.

Production processes to which the present invention is applied are not limited. For example, the present invention can be applied to a method for forming a low-k polysiloxian polymer film wherein the residence time of a reaction gas is controlled. One example of such a method is U.S. patent application Ser. No. 09/827,616, filed Apr. 6, 2001. The disclosure of the U.S. patent application is herein incorporated by reference in its entirety.

In the present invention, the type of material gas usable is not limited to those disclosed in the above United States Patent Application, and it can be selected from a variety of material gases. For example, usable is an organic silicon gas such as $Si_xO_{x-1}R_{2x-y+1}(OC_nH_{2n+1})_y$, wherein x is an integer of 1–3, y is 0, 1, or 2, n is an integer of 1–3, and R is C1–6 hydrocarbon attached to Si, and $Si_xO_{x-1}R_{2x+1}$, wherein x is an integer of 1–3, and R is C1–6 hydrocarbon attached to Si.

Usable material gas may include $Si(CH_3)_3$—O—$Si(CH_3)_3$, $Si(CH_3)_3$—O—$Si(CH_3)$—O—$Si(CH_3)_3$.

Usable material gas may further include $SiH_n(CH_3)_{4-n}$, $Si(CH_3)_4$, $Si(CH_3)_3$, $SiH_4$.

U.S. Pat. No. 6,455,445 issued Sep. 24, 2002, U.S. Pat. No. 6,352,945 issued Mar. 5, 2002, U.S. Pat. No. 6,383,955 issued May 7, 2002, U.S. Pat. No. 6,410,463 issued Jun. 25, 2002, and U.S. Pat. No. 6,432,846 issued Aug. 13, 2002, disclose material gases which are also usable in the present invention. The disclosure of each U.S. patent application is herein incorporated by reference in its entirety.

An object of the present invention in one embodiment is forming a low-k film, and not only an organic silicon gas but also a silicon gas such as $SiH_4$ can be used, and by introducing an oxidizing gas in a pulse cycle, a film having a porous structure can effectively be formed.

Further, in the present invention, any suitable CVD apparatuses can be used including an apparatus wherein an intermediate electrode is disposed between an upper electrode and a lower electrode. For example, the present invention can be applied to apparatuses and methods disclosed in U.S. patent application Ser. No. 09/851,809, filed Nov. 24, 2000. The disclosure of the U.S. patent application is herein incorporated by reference in its entirety.

By introducing an oxidizing gas in a pulse cycle, the sum of introduced oxidizing gas can be increased. That is, if the flow of oxidizing gas increases, dust (nano-particles) increases, causing a plasma to be unstable due to an increase in reactivity. By introducing an oxidizing gas in a pulse cycle, it is possible to increase the flow of oxidizing gas while suppressing the formation of dust (nano-particles) or stopping the growth of it at some size of the dust.

The cycled introduction of oxidizing gas is effective in stabilizing a plasma by suppressing growth of nano-particles, regardless of the amount of introduced oxidizing gas. Even when at a low flow of oxidizing gas, by introducing it in a pulse cycle, a low-k film can effectively and stably be formed as compared with constant introduction of oxidizing gas. In a low flow oxidizing gas step, reactivity decreases, while in a high flow oxidizing gas step, reactivity increases, suppressing growth of nano-particles (dust) and stabilizing a plasma. A high quality of a low-k film can be formed.

Oxidizing gas can be introduced in a pulse cycle which includes the following:

The oxidizing gas flow in high flow steps is higher than that in low flow steps to any degree.

For example, in oxidizing gas high flow steps, the oxidizing gas flow may be approximately 50% or higher of the silicon gas flow, preferably 50% to 300% (including 100% to 200%). In an embodiment, this may be approximately 50 sccm to 500 sccm of oxidizing gas (including 100 sccm to 300 sccm).

In oxidizing gas low flow steps, the oxidizing gas flow may be approximately 50% or lower of the silicon gas flow, preferably 0% to 50% (including 10% to 30%). In an embodiment, this may be approximately 0 sccm to 100 sccm of oxidizing gas (including 10 sccm to 50 sccm).

One cycle of the high flow and the low flow is set at approximately 10 msec to 10 sec, preferably 0.05 sec to 5 sec (including 0.1 sec to 1 sec).

The cycles may be in an on-off pulse (e.g., a digital pulse) or in a sin wave (e.g. an analog pulse), or in any other waves.

The cycled introduction of oxidizing gas can be conducted at all times when oxidizing gas is introduced or only after the flow of oxidizing gas exceeds a certain level where the introduction of oxidizing gas may cause a plasma to be unstable (e.g., at more than 50% of silicon gas).

Oxidizing gas may be $O_2$, $N_2O$, or any other gas which is capable of causing oxidization during polymerization by plasma reactions.

A reaction gas may include a silicon gas and an oxidizing gas, and if suitable, an inert gas such as He, Ar, and Kr. These gas flows may be controlled separately by gas controllers.

The plasma reaction's conditions and apparatuses can be those disclosed in any of the above mentioned U.S. patent applications.

EXAMPLE

An embodiment of the present invention will be explained with reference to figures and examples. However, the present invention should not be limited to this embodiment.
Device Configuration FIG. 1 is a view showing a parallel-flat-plate type of a CVD device using a capacity-coupling system usable in the present invention. By placing two pairs of conductive flat-plate electrodes 1, 2 in parallel and facing each other in a reaction chamber 4, and by applying 27 MHz RF power 7 to one side and grounding the other side, a plasma is excited between these two pairs of electrodes 1, 2. A substrate 3 is placed on the lower electrode 2. A temperature regulator is installed in the lower stage 2 and a constant temperature of approximately 400° C. (400° C. to 450° C. in other embodiments) is kept in the lower stage. DM-DMOS (Dimethyldimetoxysilane, $Si(CH_3)_2(OCH_3)_2$), inactive gas such as He, Ar and Kr and oxidizing gas such as $O_2$ and $N_2O$ are mixed and used as a reaction gas. A flow of these gases is regulated respectively at a prescribed flow by flow regulators (now shown). These gases are mixed and are introduced into an inlet port 6 provided at the top of an upper electrode (shower plate) 1 as a reaction gas. Regarding a flow of oxidizing gas, two steps, a prescribed relatively large flow (approximately 5 sccm to 50 sccm) that is half to approximately 3 times larger than a flow of silicon gas and a prescribed relatively smaller flow (approximately 0 sccm to sccm) that is zero to approximately half to a flow of silicon gas, are repeated by pulse control in cycles of approximately 10 msec to 10 sec. In the upper electrode 1,500 to 10,000 fine pores with a diameter of approximately 0.5 mm are made (3,000 fine pores were made in the embodiment), and the reaction gas introduced flows into the reaction zone 8 through these fine pores. Additionally, the upper electrode 1 is kept at a constant temperature in a range of 120° C. to 350° C. To promote reaction of the reaction gas, a higher temperature is preferable. The air in the reaction zone 8 is exhausted using a vacuum pump through an exhaust port 5 and a pressure in the reaction zone is kept at a prescribed constant pressure of approximately 130 Pa to 2,000 Pa (400 Pa to 1,000 Pa in other embodiments).
Deposition Reaction By adding DM-DMOS as material gas and $O_2$ to the reaction gas, a film of approximately k=2.45 was formed as described in U.S. patent application Ser. No. 09/827,616, filed Apr. 6, 2002.

For comparison, a dielectric constant value of a film formed was measured by changing an amount of oxygen added to DM-DMOS using the plasma CVD device in which RF power was kept at a constant level by the technique according to the present invention. With a pressure of 620 Pa, a temperature of the upper electrode (shower plate) kept at 240° C., and a susceptor temperature kept at 400° C., a film was formed with a gap between these electrodes, the shower plate and the susceptor, set to 24 mm. In the reaction zone, 140 sccm of DM-DMOS and 80 sccm of He were mixed. By changing a flow of oxygen added to the mixed gas from 0 sccm to 70 sccm, a dielectric constant value of a film formed under respective conditions was measured. At this time, 1000 W of 27 MHz RF power was applied. A k value was 2.75 when $O_2$ added was 0 sccm. The dielectric constant decreased by increasing a flow of oxygen added. By increasing $O_2$ to 70 sccm, the dielectric constant decreased to k=2.46 (FIG. 2).

However, if a flow of oxygen was increased above 7 sccm, high-quality films could not be obtained because dust was generated in the reaction zone and was accumulated on the film as well. Additionally, particles generated disrupted a stable plasma position; hence deposition could not be carried on. For this reason, it was impossible to increase a flow of oxygen further and it was impossible to lower the dielectric constant to below 2.45.

It is considered that increasing a flow of oxygen increases the reactivity of the reaction zone and the size of fragments formed in the reaction zone, which lowers the dielectric constant value because the film obtained includes vacancies or pores between fragments accumulated. It is inferred that when an oxygen flow increased, the size of fragments forming in the reaction zone increased, a vacancy rate or porosity of the film increased and a dielectric constant decreased. However, lowering a k value up to approximately 2.45 is the limit in this method. If increasing an oxygen amount more than that, dust is generated in the reaction zone and high-quality films cannot be obtained, and the dielectric constant of these films cannot be measured. Additionally, a plasma becomes unstable and a stable reaction cannot be maintained.

The present invention can form a low dielectric constant film by pulsing oxygen to be introduced. Using the same conditions as those of a comparative experiment (Pressure: 620 Pa, RF Power (27 MHz): 1000 W, and DM-DMQS: 140 sccm, He: 30 sccm), oxygen was introduced by pulse control repeating steps of feeding 200 sccm of oxygen for 0.5 see and then 20 sccm of oxygen for 0.5 sec. With this control, an average flow of 110 sccm of oxygen was constantly flowing. In the case of a technique of a comparative example, when letting oxygen in an amount of 75 sccm or more flow, a plasma becomes unstable and stable deposition cannot be maintained. By introducing oxygen with pulse control, even when an average flow of 110 sccm of oxygen was introduced, stable deposition was maintained and a low dielectric constant film with k=2.35 was obtained Experiment Results
<Common Conditions>
Reactor setting
Upper electrode (shower plate) temperature: 240° C.
Susceptor temperature: 400° C.
Gap between the shower plate and the susceptor: 24 mm
Process conditions
DM-DMOS: 140 sccm
He: 30 sccm
RF Power 27 MHz: 1000 W
Pressure: 620 Pa
Process Time for Film Formation: See the table below.
<Conditions for the Comparative Experiment>
Oxygen was introduced a steady state, deposition was performed on a Si substrate and a dielectric constant value was measured.

| Oxygen Flow Added | Dielectric Constant | Process Time |
|---|---|---|
| 0 sccm | 2.75 | 245 sec |
| 20 sccm | 2.62 | 60 sec |
| 60 sccm | 2.50 | 19 sec |
| 70 sccm | 2.46 | 17 sec |
| 75 sccm or more | Deposition was impossible due to unstable plasma | — |

<Pulsed $O_2$ Process>

By introducing oxygen by pulse control repeating steps of feeding 180 sccm of oxygen for 0.5 sec. and then 20 sccm of oxygen for 0.5 sec., a low dielectric constant film was formed on a Si substrate and a dielectric constant was measured. With this control, an average flow of 110 sccm of oxygen was constantly flowing. By introducing oxygen with pulse control, plasma remained stable and a low dielectric constant film with k=2.35 was obtained.

Additionally, in the end, by stopping flowing oxygen, and forming a protective film of 50 nm only using DM-DMOS and He, preventing moisture absorption from without is possible.

In the present invention, an oxidizing gas is introduced into a chamber in pulses, and also, the intensity of RF power can be pulsed in cycles synchronized with the pulsed flow of the oxidizing gas. The above aspect can be accomplished in various ways. For example, the film formation process can be comprised of multiple steps of film formation which are continuously conducted in sequence. In different steps, the flow of an oxidizing gas and/or the intensity of RF power can be pulsed in different cycles. In another embodiment, the flow of an oxidizing gas and/or the intensity of RF power in pulses can be changed in different steps. Further, different steps can be comprised of at least one pulse-conducting step and at least one non-pulse-conducting step. For example, the process comprises two steps, wherein a first step is a pulse-conducting step, and a second step is a non-pulse-conducting step.

Further, in the present invention, a chamber into which an oxidizing gas is introduced in pulses need not be a reaction chamber itself. The chamber can be any suitable reaction space which can be defined functionally and need not be defined by a physical structure. For example, if the reaction chamber is divided into several zones depending on the temperatures, pressures, and/or gas flows, a zone wherein plasma reaction takes place may be a reaction space.

The present invention can be realized in various embodiments which include but are not limited to the following:

1) By pulse control in a cycle of 1 msec. or more, oxidizing gas is introduced in a reaction zone and a low dielectric constant film of k<3.0 is formed in a CVD method.
2) By introducing in pulses oxidizing gas together with a reaction gas containing at least Si, C and H chemical elements, a low dielectric constant film is formed in the CVD method.
3) The method for forming a low dielectric film using oxygen or $N_2O$ as the oxidizing gas used in Item 2.
4) The method as described in Item 3, wherein a low dielectric constant film is formed by a plasma CVD method using capacity coupling system.
5) In a method as described in Item 4, a low dielectric constant film is formed using a reaction gas containing at least an organic silicon gas of SixCyOzHa (wherein a, x, y, z are integers of at least one).
6) A method for forming a low dielectric constant film, which uses $Si_\alpha O_{\alpha-1} R_{2\alpha-\beta+1}(OC_nH_{2n+1})_\beta$ (wherein α is an integer of 1 to 3, , β is 0, 1 or 2, n is an integer of 1 to 3, and R is $C_{1-6}$ hydrocarbon attached to Si) as the organic silicon gas as described in Item 5.
7) A method for forming a low dielectric constant film, which uses $Si_\alpha O_{a-1} R_{2\alpha+1}$ (wherein α is an integer of 1 to 3, R is $C_{1-6}$ hydrocarbon attached to Si) as the organo silicon gas as described in Item 5.
8) A method for forming a low dielectric constant film, which uses $Si_4O_4(CH_3)_8$ or $Si_4O_4(CH_3)_4H_4$ as the organo silicon gas as described in Item 5.
9) A method for forming a low dielectric constant film, which uses Dimethydimethoxysilane or Dimethoxytetramethydisiloxane as the organo silicon gas as described in Item 6.
10) A method for forming a low dielectric constant film, which introduces oxygen to be introduced in cycles of 5 msec to 10 sec.
11) A method for forming a low dielectric constant film, which introduces oxygen to be introduced in cycles of 10 msec to 5 sec.
12) A method for forming a low dielectric constant film by flowing oxygen to be added periodically in a cycle comprising a high-flow step in which a flow of oxygen is half or more of a flow of organic silane gas to be brought in as a material gas, and a low-flow step in which a flow of oxygen is half or less (including zero) of a flow of the organic silane gas, and using these mixed gases as a reaction gas.
13) A method for forming a low dielectric constant film with a dielectric constant of k<2.45.
14) A method for forming a low dielectric constant film, wherein RF power is controlled at a high state and a low state in the same cycle as that of changing a flow of oxidizing gas.
15) A method for forming a low dielectric constant film, wherein RF power is raised at the timing that the concentration of oxidizing gas in a reaction zone is increased and is lowered at the timing that the concentration of the oxidizing gas is decreased.

16) A method for forming a low dielectric constant film, wherein RF power applied to the reaction zone is controlled at a high power state and at a low power state in a cycle of 1 msec. or more.

17) A low dielectric constant film is formed by maintaining a temperature of a shower plate at 150° C. or more.

18) A method for forming a low dielectric constant film, wherein by forming a Cap layer of 10 nm or more with a flow of oxidizing gas at a rate used in the low-flow step or a small flow including zero thereof at the end of film formation, the final protective film is formed.

Further, the thin film formed by the present invention can be subjected to additional treatment to accomplish desired film properties. For example, upon completion of film formation, a thin cap film layer, which has a relatively high density and dielectric constant and has a thickness of 50–100 nm, can be formed on the film surface in order to prevent moisture absorption phenomena when being exposed to the outer environment after the film formation. In order to render the film surface hydrophilic, the surface can be treated by exposing the film surface to an oxidizing gas plasma. Further, by radiating the film surface with electron rays or UV light, or by exposing the film surface to a plasma, the strength of the film can be improved.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A method for forming an insulation film on a semiconductor substrate, comprising the steps of:
    (i) introducing a source gas comprising a compound composed of at least Si, C, and H into a chamber;
    (ii) introducing in pulses an oxidizing gas into the chamber, wherein the source gas and the oxidizing gas form a reaction gas for plasma excitation, said pulses being in cycles of 5 msec to 10 sec, wherein the total of the pulsing oxidizing gas flow during step (ii) is such that a plasma is unstabilized and no film is formed in step (iii) if the oxidizing gas flow is not in pulses; and
    (iii) forming an insulation film on a semiconductor substrate by plasma treatment of the reaction gas while repeating the pulse cycles of the oxidizing gas flow.

2. The method according to claim 1, wherein the plasma treatment is plasma CVD processing.

3. The method according to claim 1, wherein the compound is an organo silicon of SixCyOzHa wherein a, x, y, and z are integers.

4. The method according to claim 1, wherein the oxidizing gas is introduced in the chamber in cycles of 100 msec to 5 sec.

5. The method according to claim 1, wherein the oxidizing gas is oxygen or $N_2O$.

6. The method according to claim 1, wherein the introduction of the oxidizing gas in pulses is conducted by introducing alternately (i) a first reaction gas comprising the source gas at a base flow rate and the oxidizing gas at a flow rate of 50% or higher of the base flow rate, and (ii) a second reaction gas comprising the source gas at a base flow rate and no oxidizing gas or the oxidizing gas at a flow rate of 50% or less of the base flow rate.

7. The method according to claim 1, wherein the total flow of the oxidizing gas is less than the flow of the source gas.

8. The method according to claim 1, wherein the source gas further comprises an inert gas.

9. The method according to claim 1, wherein the pulses and the flow of the oxidizing gas are selected to adjust a dielectric constant of the insulation film to 2.45 or less.

10. The method according to claim 1, wherein a plasma is formed by RF power.

11. The method according to claim 10, wherein the intensity of RF power is pulsed in cycles synchronized with the pulsed flow of the oxidizing gas.

12. The method according to claim 11, wherein the intensity of RF power is higher in cycles when the oxidizing gas flow is low than in cycles when the oxidizing gas flow is high.

13. The method according to claim 10, wherein the intensity of RF power is pulsed in cycles of 1 sec or more.

14. The method according to claim 1, wherein the formation of the insulation film is conducted while maintaining a temperature of a shower plate at 150° C. or higher, through which the reaction gas passes into the chamber.

15. The method according to claim 1, wherein the insulation film is a cap layer having a thickness of 10 nm or more.

16. A method for forming an insulation film having a dielectric constant of 2.45 or lower on a semiconductor substrate, comprising the steps of:
    (i) introducing a source gas comprising a compound composed of at least Si, C, and H into a chamber;
    (ii) introducing in pulses an oxidizing gas into the chamber, wherein the source gas and the oxidizing gas form a reaction gas; and
    (iii) forming the insulation film of a siloxan polymer on a semiconductor substrate by plasma treatment of the reaction gas using the pulsing oxidizing gas flow.

17. The method according to claim 16, wherein in step (ii), the oxidizing gas is introduced in the chamber in cycles of 100 msec to 5 sec.

18. A method for forming an insulation film on a semiconductor substrate, comprising the steps of:
    introducing a source gas comprising a compound composed of at least Si, C, and H into a chamber;
    introducing an oxidizing gas into the chamber, wherein the source gas and the oxidizing gas form a reaction gas;
    oscillating the oxidizing gas flow between a low flow and a high low in cycles of 5 msec to 10 sec while RF power is applied for plasma excitation of the reaction gas; and
    forming one insulation film of a siloxan polymer on a semiconductor substrate by plasma treatment of the reaction gas while repeating the cycles of the oxidizing gas flow.

19. The method according to claim 18, wherein the total of the oscillating oxidizing gas flow is such that a plasma is unstabilized and no film is formed without the oscillation of the oxidizing gas flow.

20. The method according to claim 18, wherein the pulses and the flow of the oxidizing gas are selected to adjust a dielectric constant of the insulation film to 2.45 or less.

21. The method according to claim 18, wherein the high flow is about 50 sccm to about 500 sccm, and the low flow is about 0 sccm to about 100 sccm.

22. A method for forming an insulation film on a semiconductor substrate, comprising the steps of:
    introducing a source gas comprising a compound composed of at least Si, C, and H into a chamber;
    introducing an oxidizing gas into the chamber, wherein the source gas and the oxidizing gas form a reaction gas for plasma excitation;

applying RE power to the chamber to generate a plasma using the reaction gas;

stabilizing the plasma by oscillating the oxidizing gas flow between a low flow and a high low in cycles of 5 msec to 10 sec; and forming one insulation film on a semiconductor substrate by plasma treatment of the reaction gas while repeating the cycles of the oxidizing gas flow.

23. The method according to claim 22, wherein the insulation film has a dielectric constant of 2.45 or less.

24. The method according to claim 22, wherein the total of the oscillating oxidizing gas flow is such that a plasma is unstabilized and no film is formed without the oscillation of the oxidizing gas flow.

25. The method according to claim 22, wherein one cycle of the high flow and the low flow is set at about 0.1 sec to about 1 sec.

* * * * *